(12) United States Patent
Park

(10) Patent No.: US 7,919,833 B2
(45) Date of Patent: Apr. 5, 2011

(54) SEMICONDUCTOR PACKAGE HAVING A CRACK-PROPAGATION PREVENTING UNIT

(75) Inventor: Yun Mook Park, Cheongju-si (KR)

(73) Assignee: Nepes Corporation, Chungbuk (KR)

( * ) Notice: Subject to any disclaimer, the term of this patent is extended or adjusted under 35 U.S.C. 154(b) by 61 days.

(21) Appl. No.: 12/023,579

(22) Filed: Jan. 31, 2008

(65) Prior Publication Data
US 2009/0091001 A1  Apr. 9, 2009

(30) Foreign Application Priority Data

Oct. 9, 2007  (KR) .......... 10-2007-0101343

(51) Int. Cl.
*H01L 23/544* (2006.01)
(52) U.S. Cl. ......... 257/620; 257/E23.002; 257/E23.135; 257/E23.194
(58) Field of Classification Search ............... 257/620, 257/E23.002, E23.135, E23.194
See application file for complete search history.

(56) References Cited

U.S. PATENT DOCUMENTS

| 6,326,701 B1* | 12/2001 | Shinogi et al. | 257/797 |
| 6,341,070 B1* | 1/2002 | Yu | 361/760 |
| 2001/0018229 A1* | 8/2001 | Kato et al. | 438/106 |
| 2005/0048740 A1* | 3/2005 | Noma et al. | 438/460 |
| 2006/0076651 A1* | 4/2006 | Tsutsue | 257/620 |
| 2006/0163699 A1* | 7/2006 | Kumakawa et al. | 257/620 |
| 2008/0128864 A1* | 6/2008 | Cho | 257/620 |

FOREIGN PATENT DOCUMENTS

KR  1020010085725  9/2001

* cited by examiner

*Primary Examiner* — Wael M Fahmy
*Assistant Examiner* — Sarah K Salerno

(57) ABSTRACT

There are provided a semiconductor package comprising: a semiconductor substrate including an integrated circuit unit, and a crack-propagation preventing unit at least partially formed around a peripheral of the integrated circuit unit of the semiconductor substrate and filled with a heterogeneous material different from a material of the semiconductor substrate, and a method of fabricating the semiconductor package, comprising: at least partially forming a trench around the peripheral of the integrated circuit unit of the semiconductor substrate, and filling the trench with a heterogeneous material different from that of the semiconductor substrate. In accordance with the present invention, the structural and mechanical strength and durability of the semiconductor package, specifically, the wafer level semiconductor package, are improved and the reliability of the product is significantly improved. Furthermore, a fail rate including crack/chipping during a subsequent mounting process lowers, to improve the yield and reduce the whole manufacturing cost.

7 Claims, 8 Drawing Sheets

270

270

270

SEMICONDUCTOR PACKAGE HAVING A CRACK-PROPAGATION PREVENTING UNIT

CROSS-REFERENCE TO RELATED APPLICATIONS

This U.S. non-provisional patent application claims priority under 35 U.S.C. §119 of Korean Patent Application No. 2007-101343, filed Oct. 9, 2007, the contents of which are incorporated herein by reference in their entirety.

FIELD OF TIE INVENTION

The present invention relates to a semiconductor package and a method of fabricating the same, and more particularly, to a new semiconductor package which fundamentally prevents a physical defect such as a crack or partial chipping from propagating within the package.

BACKGROUND OF THE INVENTION

A semiconductor device is capable of performing diverse operations with a number of electric devices integrated in a single substrate. For this purpose, various high-technical fabrication methods have been used, and each device in the semiconductor device being fabricated has been developed to be miniaturized as a component in smaller dimensions.

SUMMARY

Semiconductor systems of high-integration and high-capacity have been proposed by developing packaging technology of semiconductor devices. The semiconductor packaging technology has been changed from a wire bonding to a flip-chip bumping capable of realizing a chip scale, to meet the market requirements.

Further, there has been proposed a method of completing a semiconductor package at wafer level, to reduce the size of each electronic applicable device by reducing a package area. FIG. 1 illustrates a semiconductor package 100 which is individually separated after a packaging process is performed on a plurality of semiconductor chips at wafer level. An integrated circuit unit 120 is formed in a semiconductor substrate 110. An electrode terminal 125 of the integrated circuit unit 120 is electrically connected to one end of a redistribution conductive layer 140. The redistribution conductive layer 140 having one end which is partially exposed by a plurality of dielectric layers 130 and 132 is electrically connected to a lower metal layer 150 and a solder bump 160 as electrode terminals for external connection.

When a semiconductor chip or a semiconductor package is formed in a very small size and to a very thin thickness as a semiconductor device has been developed to be light, thin, short and small, it becomes brittle by a mechanical impact.

Specifically, when a semiconductor package is fabricated at wafer level and is sawed to be separated in individual packages as illustrated in FIG. 1, the mechanical defect or fail, such as a fine crack 170 or a partial chipping 172, may occur around a sawing line X.

This defect is likely to propagate in the semiconductor chip in a subsequent process, to considerably decrease the structural stability of the semiconductor chip or semiconductor package. Moreover, there is a serious problem in that the propagation of the structural defect results in the operational incapability of the semiconductor device.

Specifically, in a wafer level semiconductor package, when a semiconductor chip is mounted on an external substrate such as a printed circuit board (PCB), the back of the semiconductor chip may be exposed. Then, when a drop test or a physical impact test of applying a mechanical impact is performed, the possibility of the crack or partial chipping becomes high because the edge part of the semiconductor chip is brittle.

The mechanical or structural defect of the semiconductor chip or semiconductor package drops the reliability of the wafer level package process and becomes an obstacle in providing a light, thin, short and small semiconductor device.

Therefore, the present invention is directed to provide to a new semiconductor package which has high structural stability against an internal mechanical defect or an external impact.

Another object of the present invention is to provide a method of fabricating a wafer level semiconductor package which prevents a defect such as a crack from propagating and secures impact-resistance.

The other objects and characteristics of the present invention will be presented in more detail below.

In accordance with an aspect of the present invention, the present invention provides a semiconductor package which has crack-resistance, comprising: a semiconductor substrate including an integrated circuit unit, and a crack-propagation preventing unit at least partially formed around the integrated circuit unit of the semiconductor substrate and filled with a heterogeneous material different from a material of the semiconductor substrate.

The crack-propagation preventing unit may be formed by filling a trench vertically perforating through the semiconductor substrate with a heterogeneous material different from the material of the semiconductor substrate. Further, the trench may be integrally formed in a closed curve or closed polygonal shape, along the peripheral of the integrated circuit unit of the semiconductor substrate, it may be formed in a regular section structure, or it may be formed to have different width in a vertical section. Further, the crack-propagation preventing unit may be formed to partially cover an edge part of the integrated circuit unit, to partially protect the integrated circuit unit.

In accordance with another aspect of the present invention, the present invention provides a method of fabricating a semiconductor package, comprising steps of: at least partially forming a trench around an integrated circuit unit of a semiconductor substrate, and filling the trench with a heterogeneous material different from a material of the semiconductor substrate.

The trench may be formed by performing dry etching or wet etching on the semiconductor substrate or by partially sawing the semiconductor substrate. Preferably, the heterogeneous material to be filled inside the trench may be a material different from the material of the semiconductor substrate in the physical or mechanical properties such as elastic coefficient strength and viscosity, for example, epoxy resin.

After the inside of the trench is filled, a bottom surface of the semiconductor substrate may be thinned to expose a crack-propagation preventing unit and to reduce a thickness of the whole package.

In accordance with another aspect of the present invention, the present invention provides a semiconductor package comprising: a semiconductor substrate including an integrated circuit unit, and a crack-propagation preventing unit formed to expose the integrated circuit unit of the semiconductor substrate and to cover side and bottom surfaces of the semiconductor substrate and filled with a heterogeneous material different from a material of the semiconductor substrate.

In accordance with another aspect of the present invention, the present invention provides a method of fabricating a semiconductor package, comprising steps of: forming a trench around a sawing line of each unit device on the semiconductor substrate including a plurality of integrated circuit units, thinning the bottom surface of the semiconductor substrate to expose the trench, applying a heterogeneous material different from the material of the semiconductor substrate to the bottom surface of the semiconductor substrate and the trench, and sawing the semiconductor substrate into each integrated circuit unit.

Preferably, the thinning of the semiconductor substrate may be performed by polishing the other surface of the semiconductor substrate after attaching a supporting member to the surface of the semiconductor substrate on which the integrated circuits are formed. The method may further comprise a step of removing the material formed on the bottom surface of the semiconductor substrate by thinning the bottom surface of the semiconductor substrate, prior to the sawing of the semiconductor substrate.

In accordance with the present invention, the structural and mechanical intensity and durability of the semiconductor package, specifically, the wafer level semiconductor package, are improved, and the reliability of the product is greatly improved. Furthermore, the thin semiconductor package is prevented from warping, so that the package is easily handled during a subsequent process, such as package mounting, to increase the yield and generally reduce the manufacturing cost. Furthermore, the impact-resistance of brittle materials is improved so that various materials can be used in the packaging process.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described more fully hereinafter with reference to the accompanying drawings, in which preferred embodiments of the invention are shown.

In a semiconductor package, specifically, a wafer level semiconductor package, according to the present invention, a crack-propagation preventing unit for preventing a physical defect, such as a crack, from propagating toward the inside of a semiconductor chip is provided by forming a trench or moat to surround an outer edge of a semiconductor chip nearby a scribe lane as a sawing part to saw an individual semiconductor chip unit and by filling the inside of the trench or moat with resin, such as epoxy mold, so that the impact-resistance of the semiconductor package is improved.

Accordingly, when a sawing or dicing process is performed to separate an individual semiconductor chip during a wafer level semiconductor packaging process, although a fine crack or partial chipping occurs, this defect is fundamentally prevented from propagating in a subsequent process. Further, since a crack or partial chipping path is prevented, the semiconductor chip or semiconductor package is prevented from being damaged while a process is performed, a mechanical impact test is performed or it is used by a user. Further, since the durability of a semiconductor device against a mechanical impact is improved, the reliability of the product is significantly improved.

Figure 1:
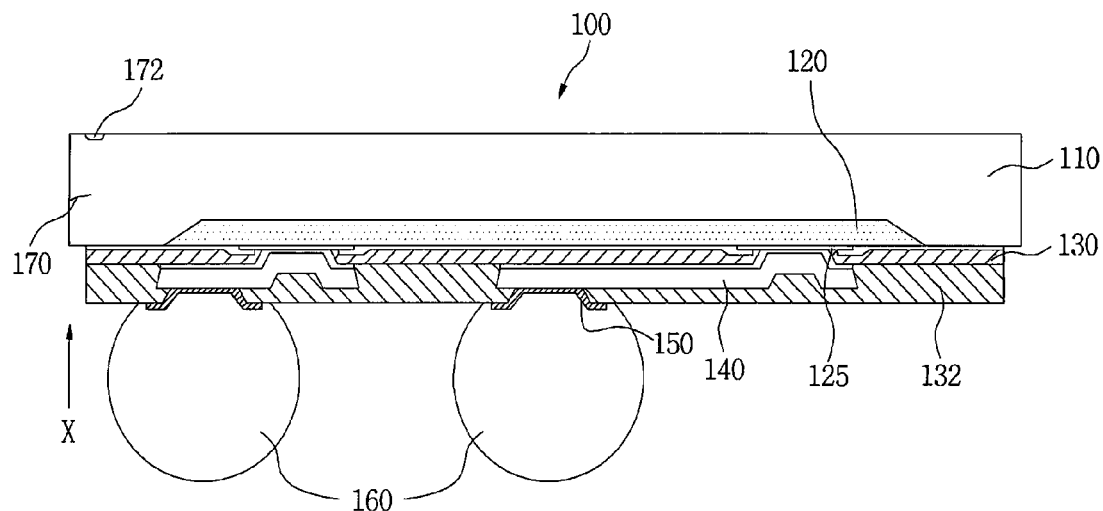
FIG. 1 is a sectional view of an example of a wafer level semiconductor package.
Figure 2:
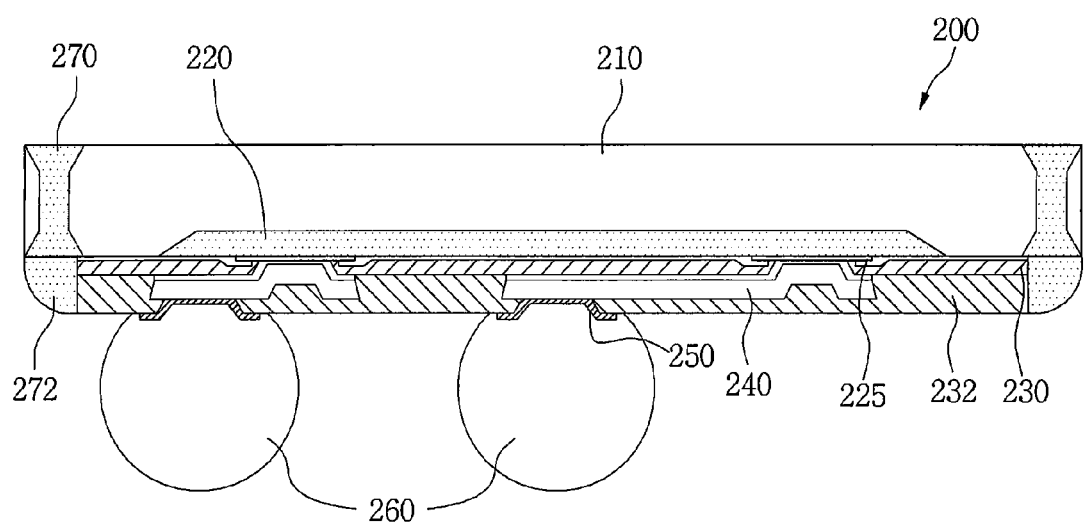
FIG. 2 is a sectional view of a semiconductor package according to an embodiment of the present invention.

FIG. 2 is a sectional view of a semiconductor package 200 according to an embodiment of the present invention.

A semiconductor substrate 210, in which an integrated circuit unit 220 including various circuit elements, such as a transistor or an electrode interconnection, is formed through a pre-process of fabricating a semiconductor, is electrically connected to an electrode terminal 225 of the integrated circuit unit 220 and a solder bump 260 for connection to an external circuit through a post process thereof.

The solder bump 260 is formed at a position different from that of the electrode terminal 225 through a redistribution conductive layer 240. The redistribution conductive layer 240 is covered by a plurality of dielectric layers 230 and 232, to be disconnected to the outside. A lower metal layer 250 is formed between the solder bump 260 and the redistribution conductive layer 240, to improve the adhesiveness of the solder bump 260.

After the redistribution conductive layer and the solder bump for each semiconductor chip are simultaneously formed at wafer level, the semiconductor package may be divided into individual semiconductor chip units. To prevent the propagation of a defect such as a crack, which may occur during a separating process into the semiconductor chip unit, a filling unit, that is, a crack-propagation preventing unit 270, which at least partially perforates through the semiconductor substrate 210, is formed outside the integrated circuit unit 220 of the semiconductor package.

Figure 3:
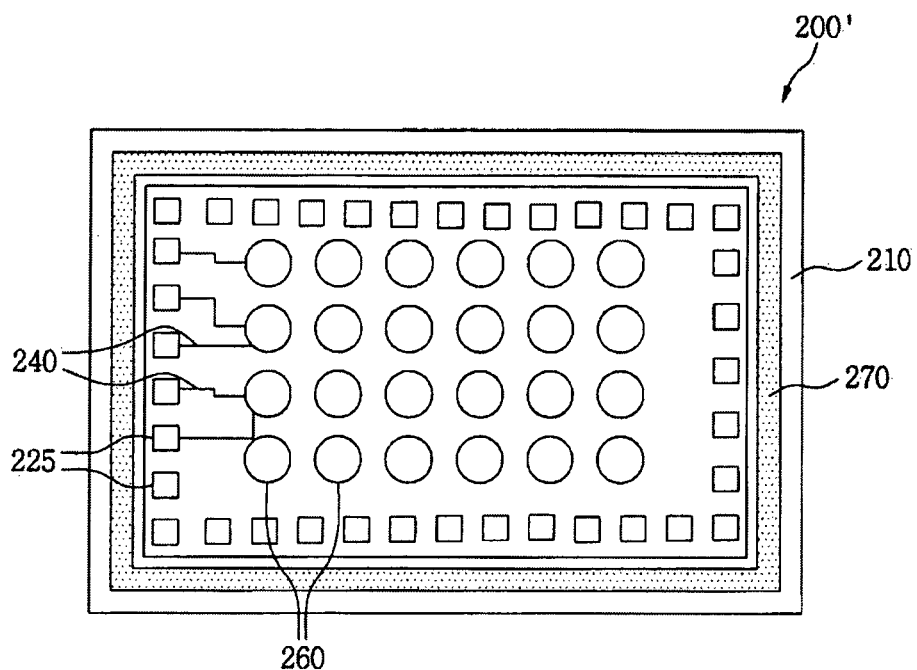
FIG. 3 is a plan view of the semiconductor package according to an embodiment of the present invention.

The crack-propagation preventing unit 270 may be completed by forming a trench partially or entirely perforating through the semiconductor substrate 210 and by filling the trench with a heterogeneous material different from a material of the semiconductor substrate 210. The crack-propagation preventing unit 270 may be formed partially around a peripheral of the integrated circuit unit 220 or it may be formed in a closed figure, along an edge of the semiconductor chip around the peripheral of the integrated circuit unit 220 as illustrated in FIG. 3. The crack-propagation preventing unit 270 in the closed figure has a similar shape to a moat formed along an edge of the semiconductor substrate 210.

Preferably, the crack-propagation preventing unit 270 may be filled with a heterogeneous material different from the material of the semiconductor substrate 210. Specifically, the material having physical and mechanical properties different from those of the semiconductor substrate 210 may be used, and the material is excellent in elasticity, viscosity and fragility compared to that of the semiconductor substrate 210, to have high resistance to an external impact and high durability to a defect such as a crack. For this purpose, a high molecular substance, such as resin, may be filled in the trench structure formed on the semiconductor substrate 210. The present invention does not limit the material for filling the inside of the trench as the crack-propagation preventing unit 270 but it would be favorable to fill the trench with a substance using a mold material in light of the characteristic of a semiconductor packaging process.

Further, the material used for the crack-propagation preventing unit 270 preferably uses a material being little different from that of the semiconductor substrate 210 in the coefficient of thermal expansion in order to achieve purposes of preventing distortion by thermal stress in relation to the substrate as well as functioning as a buffer against a mechanical impact. For this purpose, the material used for the crack-propagation preventing unit 270 may be a first substance having the physical property to absorb the mechanical impact and a second substance having the coefficient of thermal expansion being same as or similar to that of the material of the semiconductor substrate 210. In addition, the inside of the trench of the crack-propagation preventing unit 270 may be filled with a mixture of various substances having different physical properties or a compound thereof.

The crack-propagation preventing unit 270 vertically perforates through the semiconductor substrate 210, partially expands on the top surface of the semiconductor substrate 210, and functions as a protective layer 272 to cover a side of a thin-film layer including the redistribution conductive layer 240 and the dielectric layers 230 and 232 as an upper region of the edge part of the integrated circuit unit 220. The shape of the crack-propagation preventing unit 270 may vary as illustrated later.

In FIG. 2, the crack-propagation preventing unit 270 is exposed at a back surface of the semiconductor substrate 210. Even though the trench is formed not to completely perforate through the semiconductor substrate 210, the trench structure may be formed to be exposed outward by partially forming the trench in a direction of the thickness of the semiconductor substrate 210 and then, by polishing one side of the semiconductor substrate 210.

The crack-propagation preventing unit 270 formed nearby an outer edge of the semiconductor chip functions as a dam for preventing the defect such as a crack or partial chipping, which may occur around the edge part of the semiconductor chip in the wafer level semiconductor package, from propagating toward a peripheral.

Accordingly, the stability of the semiconductor package is secured during a process of sawing the wafer level package by an individual package unit or during a process of mounting an individual semiconductor package, or during other mechanical impact tests.

Further, a semiconductor chip or wafer level semiconductor package is prevented from warping which occurs when the semiconductor chip is made to be thinner in order to fabricate semiconductor chips being lighter, thinner, shorter and smaller. Therefore, it is very easy to handle the semiconductor chip or semiconductor package during a process of mounting it onto an external circuit board, or during the other subsequent processes.

As the integration density and the operation speed of a semiconductor device have increased, an electrical connection structure for a terminal for external connection (for example, solder) of a semiconductor device has been replaced with a Cu/low-k dielectric substance lamination structure. In this case, upon the packaging process, partial chipping or crack, or delamination may occur in an electrical connection unit due to the fragility of the low-k dielectric substance. However, the aforementioned problems can be solved or fundamentally prevented by the crack-propagation preventing structure of the semiconductor package according to the present invention as above.

In the semiconductor package according to the present invention, the crack-propagation preventing unit 270 may be formed during the wafer level packaging process. As an example, a method of fabricating the semiconductor package will be described with reference to FIGS. 4 through 9.

Figure 4:
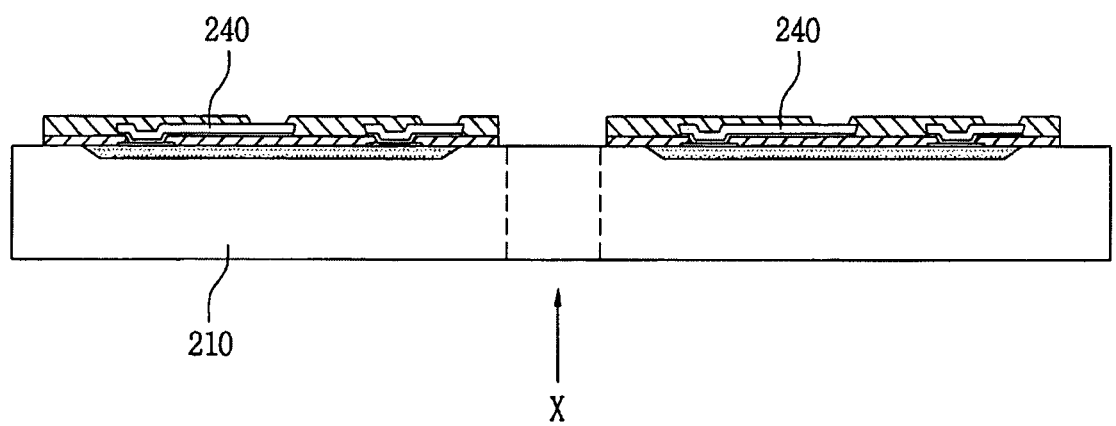
FIGS. 4 through 9 illustrate an example of a method of fabricating a semiconductor package according to the present invention.

FIG. 4 illustrates a semiconductor substrate 210 in which an integrated circuit unit is formed through pre-processes of fabricating a semiconductor. In this embodiment two semiconductor chips will be described for clarification but it will be understood by those skilled in the art that a plurality of semiconductor chips on a wafer will be able to be processed. By the wafer level packaging process, each redistribution conductive layer 240 is formed on the integrated circuit unit of the semiconductor substrate 210 and it is partially exposed by a dielectric layer. A sawing part X, which will be used for individually separating chips during a subsequent process, is disposed between unit semiconductor chips.

Figure 5:
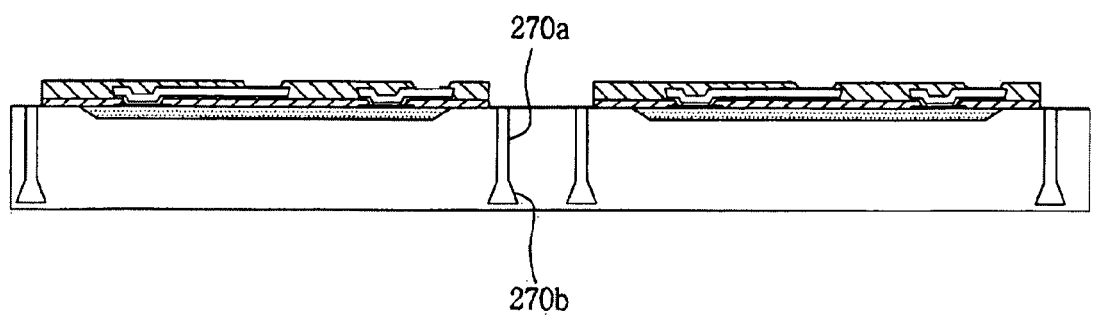

A trench or moat is formed nearby an edge of the integrated circuit unit of each semiconductor chip, adjacent to the sawing part X as illustrated in FIG. 5. The trench or moat may be formed by, for example, dry etching or wet etching. Alternatively, the trench or moat may be formed through partial-sawing by mechanical methods.

The trench or moat may be formed in a linear shape having the vertically same width but it may be formed in a vertically non-linear shape as illustrated in FIG. 5. For example, after a linear trench 270a is formed by performing anisotropic dry etching from the top surface of the semiconductor substrate 210, a non-linear trench 270b may be subsequently formed by performing isotropic wet etching. Alternatively, the sectional shape of the trench or moat may be variously changed by changing the sequence of the wet etching and the dry etching or by performing the combination thereof.

As described above, the shape of the trench or moat is variously changed to effectively improve the durability against the physical or mechanical defect occurring in the semiconductor chip or semiconductor package.

Figure 6:
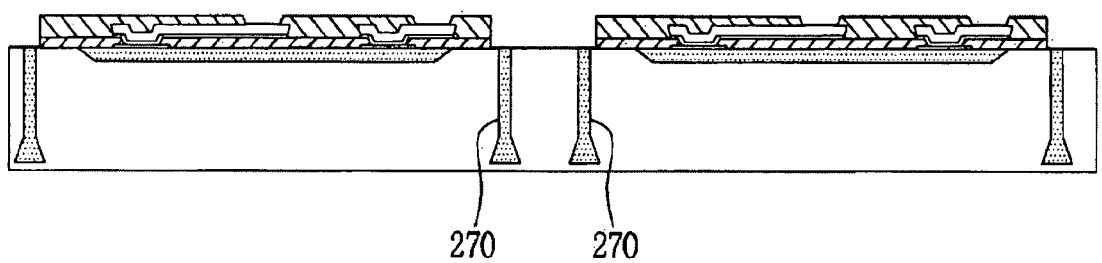

After the trench or moat is formed in the semiconductor substrate 210, the inside of the trench or moat is filled by a heterogeneous material different from a material of the semiconductor substrate 210, to complete a crack-propagation preventing unit 270 as illustrated in FIG. 6.

Figure 7:
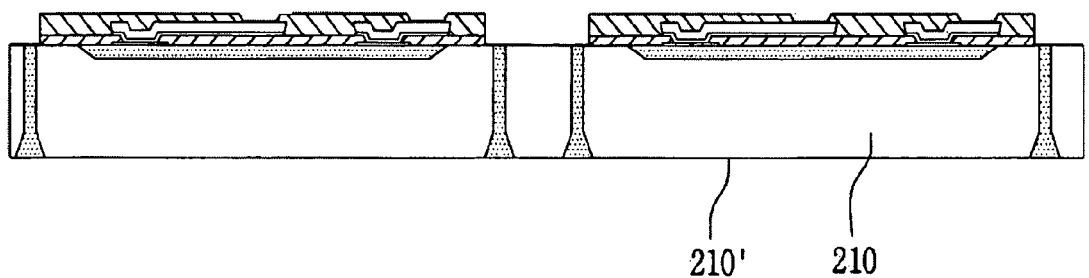

Subsequently, a back surface of the semiconductor substrate 210 is polished to be thin under the necessity as illustrated in FIG. 7. The polished back surface 210' of the semiconductor substrate is capable of securing the durability against an external impact or an internal defect because a part of the crack-propagation preventing unit 270 is exposed.

Figure 8:
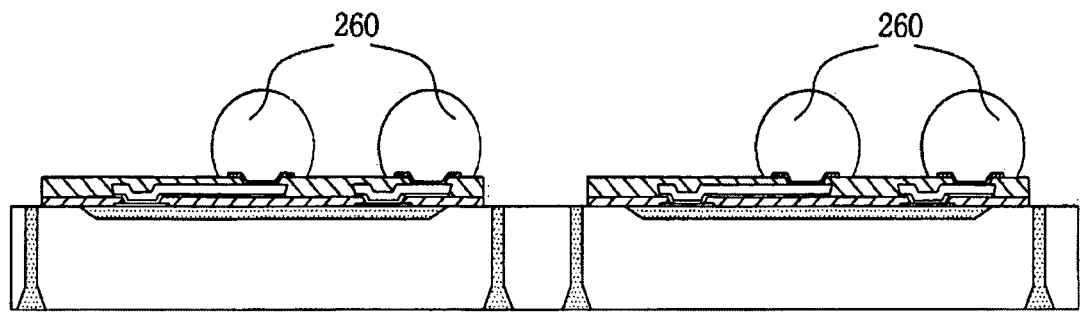

Subsequently, a solder bump 260 is formed on the integrated circuit unit, to be electrically connected to a part of the redistribution conductive layer 240 as illustrated in FIG. 8. Before the solder bump 260 is formed, preferably, a lower metal layer may be further formed to improve the adhesiveness between the redistribution conductive layer 240 and the solder bump 260.

Figure 9:
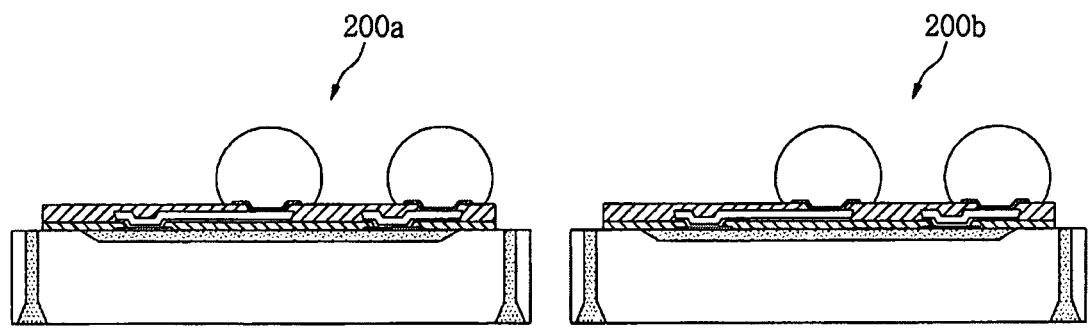

Finally, a plurality of semiconductor packages fabricated at wafer level are sawed to be separated to individual packages 200a and 200b as illustrated in FIG. 9.

In this embodiment, the crack-propagation preventing unit 270 is formed after forming the redistribution conductive layer 240 and before forming the solder bump 260. However, the order of forming the crack-propagation preventing unit 270 may be changed under the necessity. Further, the semiconductor package according to the present invention may be effectively applied to not only the wafer level package but also an individual semiconductor package or a laminated semiconductor package.

Figure 10:
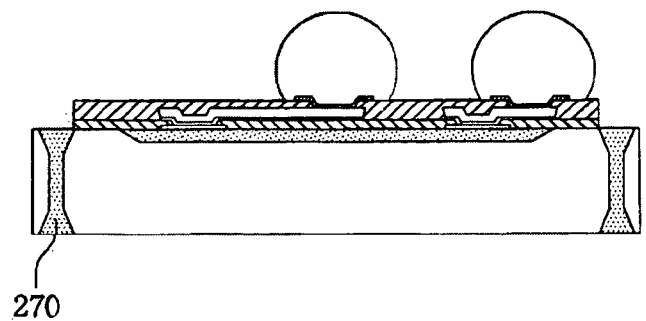
FIGS. 10 through 13 are sectional views of various examples of the semiconductor package according to the present invention.
Figure 11:
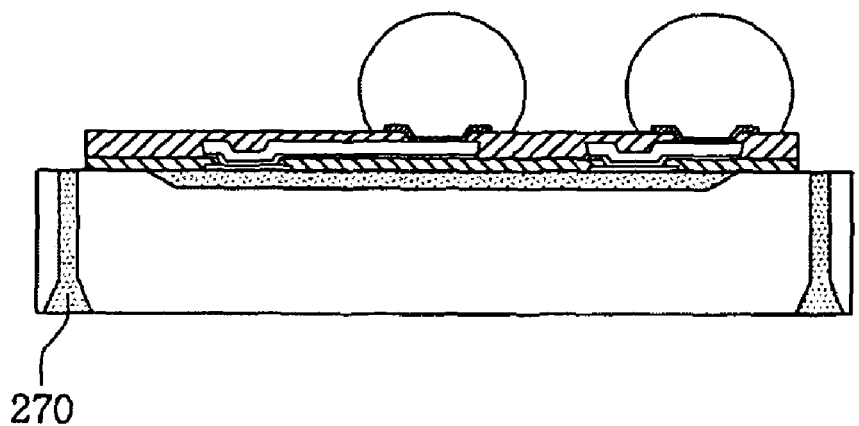
Figure 12:
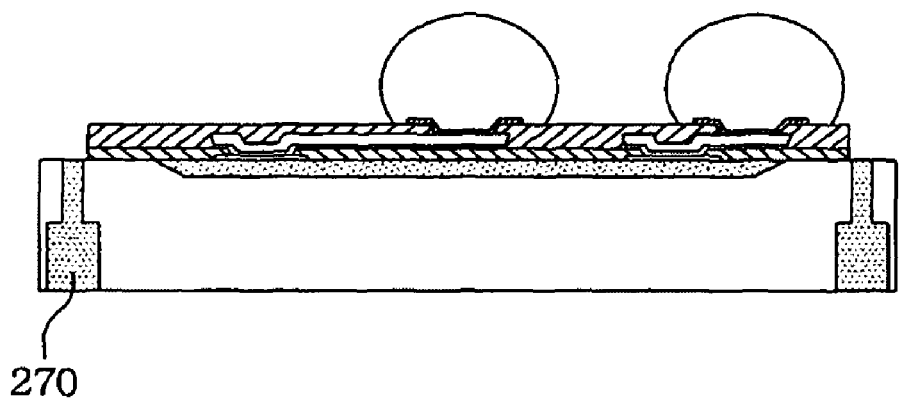

FIGS. 10 through 13 illustrate various shapes of a crack-propagation preventing unit 270 in the semiconductor package according to the present invention. The crack-propagation preventing unit 270 may be formed in an hourglass shape, in which the width at each end of both ends of the crack-propagation preventing unit 270 is widen in view of a vertical section thereof as illustrated in FIG. 10, or in a funnel shape, in which the width at only one end thereof is widen. Or, the crack-propagation preventing unit 270 may be formed so as to differentiate the width at each of both ends, so that a stair shape is internally formed as illustrated in FIG. 12. As described above, the semiconductor package has the advantage in that the physical defect which may occur on the top surface or bottom surface of the semiconductor package is prevented from propagating inside, by varying the shape of the top end or bottom end of the crack-propagation preventing unit 270.

Figure 13:
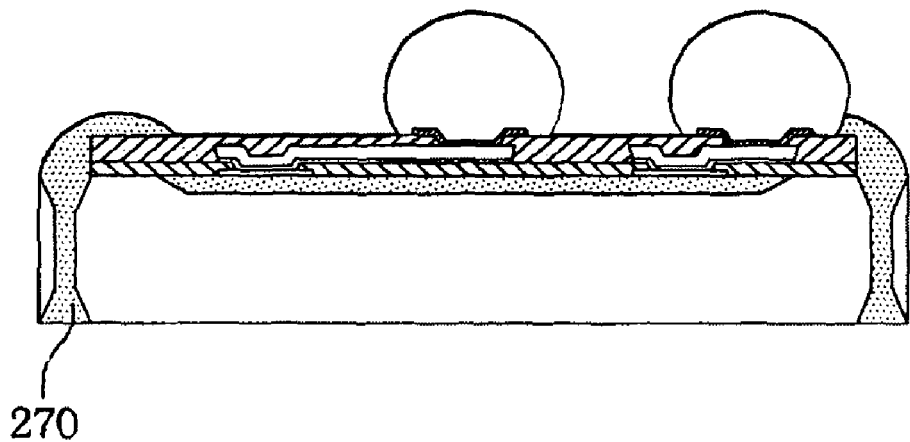

Further, the top part of the crack-propagation preventing unit 270 may be further expanded to partially cover a neighboring integrated circuit unit as illustrated in FIG. 13. Through this structure, the propagation of the mechanical chipping or crack which may be applied to the integrated circuit unit is effectively prevented. As the case may be, a molding part formed on the top surface of the semiconductor package may be replaced with the crack-propagation preventing unit 270.

Figure 14:
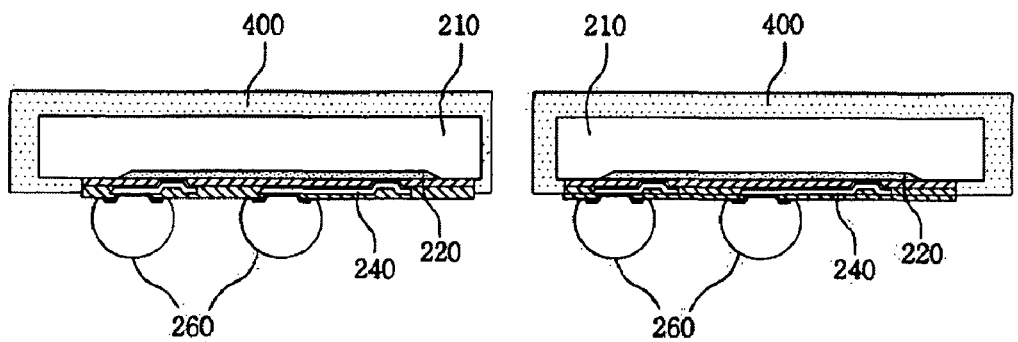
FIGS. 14 and 15 are sectional views of a semiconductor package according another embodiment of the present invention.

FIG. 14 illustrates a semiconductor package according to another embodiment of the present invention. The semiconductor package comprises: a semiconductor substrate 210 including an integrated circuit unit 220, and a crack-propagation preventing unit 400 exposing the integrated circuit unit of the semiconductor substrate 210 and covering sides and bottom surface of the semiconductor substrate 210 and formed of a heterogeneous material different from a material of the semiconductor substrate 210.

A plurality of dielectric layers and a redistribution conductive layer 240 are formed on the integrated circuit unit 220. A solder bump 260 for external connection is formed at one end of the redistribution conductive layer 240.

As a surface layer corresponding to a kind of an external molding unit, the crack-propagation preventing unit 400 protects the semiconductor substrate 210 and simultaneously prevents a crack from occurring or propagating by an external physical impact applied to the semiconductor substrate 210.

Since the crack-propagation preventing unit 400 makes it easy to form a trench and to fill the trench with a heterogeneous material from the material of the semiconductor substrate 210 in the wafer level semiconductor packaging process, which will be described later, it is very effective in realizing the semiconductor package having crack-resistance.

Figure 15:
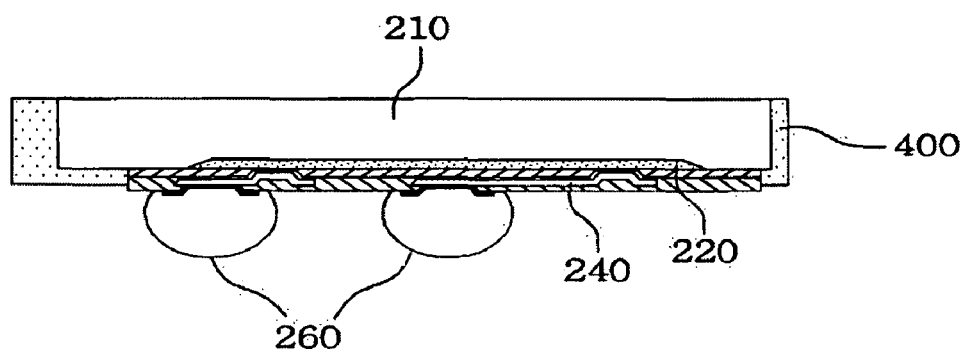

As illustrated in FIG. 15, the crack-propagation preventing unit 400 may be formed to be present only at the side of the semiconductor substrate 210, so that it is not formed at the surface on which the integrated circuit unit 220 of the semiconductor substrate 210 is not formed.

An example of a method of fabricating a semiconductor package according to the embodiment of FIG. 14 will be described with reference to FIGS. 16 through 22.

Figure 16:
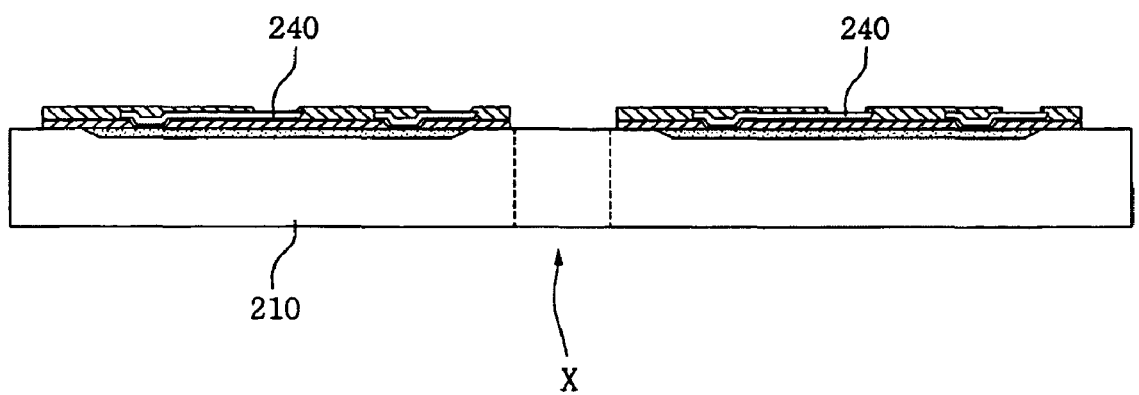
FIGS. 16 through 22 are fabrication flows of an example of a method of fabricating the semiconductor package of FIG. 14.

As illustrated in FIG. 16, a plurality of integrated circuit units are formed in a semiconductor substrate 210 at wafer level, and subsequently, a redistribution conductive layer 240 is further formed under the necessity.

Figure 17:
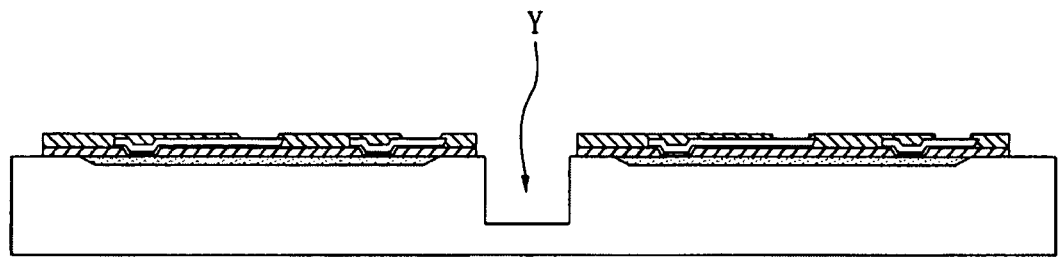

A trench Y is formed nearby a region (X-region) for sawing the semiconductor substrate 210 in which a redistribution conductive layer 240 is formed at wafer level by device units (by integrated circuit units) as illustrated in FIG. 17. Then, since the trench Y does not need to be formed in a small scale like the trench of the aforementioned embodiment (for example, 270 in FIG. 2), it may be favorable in view of a process margin.

The trench Y may be formed to perforate through the semiconductor substrate 210, along the peripheral of the integrated circuit unit, but it may be formed to a predetermined depth inside the semiconductor substrate 210.

Figure 18:
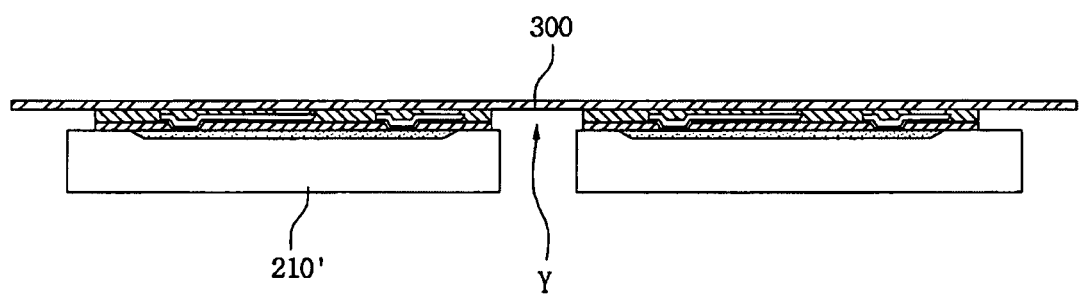

While a supporting member 300 is attached to a top surface of the semiconductor substrate 210 in which the trench is formed, and the surface on which the integrated circuit unit is formed, a bottom surface 210' of the semiconductor substrate is thinned to expose the trench to the outside as illustrated in FIG. 18. In this process, since the thickness of the semiconductor substrate 210 becomes thin, it is favorable to slim the semiconductor package.

Figure 19:
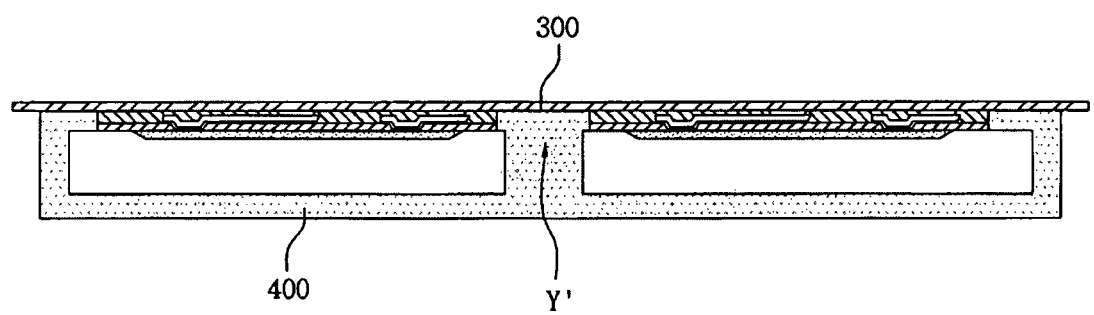

Subsequently, a crack-propagation preventing unit 400 is formed in the bottom surface 210' of the semiconductor substrate and the trench as illustrated in FIG. 19. In the aforementioned embodiment, the crack propagation preventing unit is formed by filling the trench only. However, in this embodiment, the crack-propagation preventing unit 400 is formed by filling the bottom surface 210' of the semiconductor substrate and the trench simultaneously, unlike the aforementioned embodiment. Accordingly, the fabrication process is easy, a material formed on the bottom surface 210' of the semiconductor substrate protects the semiconductor substrate, and a crack is effectively prevented from propagating upon the sawing process of the semiconductor substrate 210.

Preferably, the material forming the crack-propagation preventing unit 400 may be a material different from that of the semiconductor substrate 210, that is, a resin material, for example, epoxy and so on. The resin material may be formed at the bottom surface 210' of the semiconductor substrate and inside the trench by, for example, dispensing, coating or printing.

Figure 20:
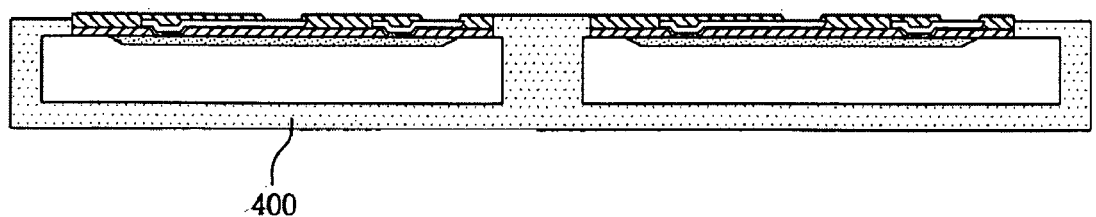
Figure 21:
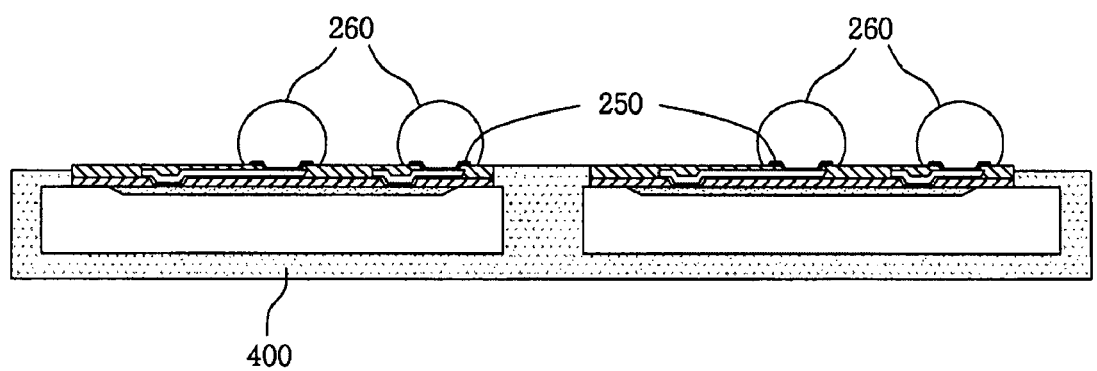

After the crack-propagation preventing unit 400 is formed, the supporting member is removed as illustrated in FIG. 20, and a lower metal layer 250 and a solder bump 260 are formed at a part of the redistribution conductive layer 240 as illustrated in FIR 21.

Figure 22:
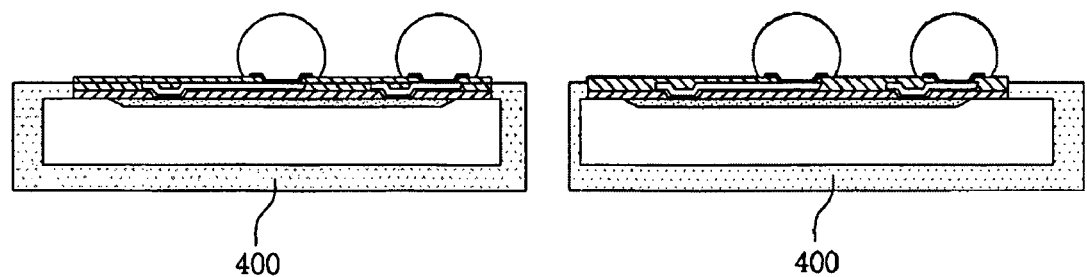

Finally, the trench Y region in which the crack-propagation preventing unit 400 is formed is sawed by each integrated circuit unit, to separate the semiconductor substrate 210 as illustrated in FIG. 22. As the case may be, the method of fabricating the semiconductor package may further include a step of removing the crack-propagation preventing unit 400 formed on the bottom surface 210' of the semiconductor substrate or polishing the bottom surface 210' of the semiconductor substrate before the semiconductor substrate 210 is sawed.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. A semiconductor package, comprising:
a semiconductor substrate including an integrated circuit unit; and
a crack-propagation preventing unit formed in a closed loop between an edge of the semiconductor package and a peripheral of the integrated circuit unit of the semiconductor substrate and filled with a heterogeneous material different from a material of the semiconductor substrate,
wherein the crack-propagation preventing unit extends vertically through the semiconductor package, and the top surface and bottom surface of the crack-propagating preventing unit are exposed on top and bottom surfaces of the semiconductor package, respectively,
wherein the crack-propagation preventing unit is embedded within the semiconductor substrate wherein the crack-propagation preventing unit is shaped like an hourglass, in which the width at each end of both ends of the crack propagation preventing unit is widened in view of a vertical section.

2. The semiconductor package of claim 1, wherein the crack-propagation preventing unit is formed by differentiating a width of a vertical section.

3. The semiconductor package of claim 1, wherein the crack-propagation preventing unit partially covers an edge part of the integrated circuit unit.

4. The semiconductor package of claim 1, further comprising:
a solder bump formed on a top surface of the integrated circuit unit, for electrical connection to the outside.

5. The semiconductor package of claim 4, further comprising: a redistribution conductive layer for electrically connecting the solder bump to an electrode terminal of the integrated circuit unit.

6. The semiconductor package of claim 1, wherein the crack-propagation preventing unit is formed of epoxy resin.

7. The semiconductor package of claim 1, wherein the crack-propagation preventing unit is laterally spaced apart from the edge of the semiconductor package.

* * * * *